United States Patent
Wang et al.

(10) Patent No.: US 10,477,706 B1
(45) Date of Patent: Nov. 12, 2019

(54) SOLID STATE MEMORY DEVICE

(71) Applicant: Shannon Systems Ltd., Shanghai (CN)

(72) Inventors: Xinglong Wang, Shanghai (CN); Jiangshan Li, Shanghai (CN)

(73) Assignee: SHANNON SYSTEMS LTD., Shanghai (CN)

( * ) Notice: Subject to any disclaimer, the term of this patent is extended or adjusted under 35 U.S.C. 154(b) by 0 days.

(21) Appl. No.: 16/423,438

(22) Filed: May 28, 2019

(30) Foreign Application Priority Data

Mar. 7, 2019 (CN) .......................... 2019 1 0170862

(51) Int. Cl.
| | | |
|---|---|---|
| H05K 5/00 | (2006.01) | |
| H05K 1/14 | (2006.01) | |
| H05K 1/18 | (2006.01) | |
| H05K 5/02 | (2006.01) | |

(52) U.S. Cl.
CPC .......... *H05K 5/0047* (2013.01); *H05K 1/144* (2013.01); *H05K 1/181* (2013.01); *H05K 5/0008* (2013.01); *H05K 5/0213* (2013.01); *H05K 5/0247* (2013.01); *H05K 2201/042* (2013.01); *H05K 2201/10159* (2013.01); *H05K 2201/10522* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,155,663 | A * | 10/1992 | Harase | G06K 19/07732 273/148 B |
| 8,149,583 | B2 * | 4/2012 | Ishii | H05K 3/368 361/679.31 |
| 8,625,270 | B2 * | 1/2014 | Ni | G06F 21/32 361/679.02 |
| 10,186,471 | B2 * | 1/2019 | Chen | G11C 5/00 |
| 2008/0030944 | A1 * | 2/2008 | Lalouette | G11B 33/08 361/679.31 |
| 2008/0144270 | A1 * | 6/2008 | Dal Porto | H05K 5/0278 361/679.31 |
| 2013/0329354 | A1 * | 12/2013 | Knopf | G06F 1/1658 361/679.36 |
| 2014/0160661 | A1 * | 6/2014 | Mangay-Ayam, Jr. | G11C 5/04 361/679.31 |
| 2017/0236557 | A1 * | 8/2017 | Albrecht | G11B 33/1466 360/97.12 |

* cited by examiner

*Primary Examiner* — Lisa Lea-Edmonds
(74) *Attorney, Agent, or Firm* — McClure, Qualey & Rodack, LLP

(57) ABSTRACT

A solid state memory device is provided. The solid state memory device includes a housing and a solid state memory module. The housing includes a housing fastening member, a first housing member, and a second housing member, wherein the second housing member is connected to the first housing member. The solid state memory module is disposed in the housing. The first housing member includes a plurality of first wedging portions, and the second housing member includes a plurality of second wedging portions. Each first wedging portion wedges the corresponding second wedging portion in a first direction. The first housing member further includes a first fastening portion, and the second housing member further includes a second fastening portion. The housing fastening member affixes the first fastening portion to the second fastening portion in a second direction, wherein the first direction differs from the second direction.

10 Claims, 6 Drawing Sheets

SOLID STATE MEMORY DEVICE

CROSS REFERENCE TO RELATED APPLICATIONS

This Application claims priority of China Patent Application No. 201910170862.1, filed on Mar. 7, 2019, the entirety of which is incorporated by reference herein.

BACKGROUND OF THE INVENTION

Field of the Invention

The present invention relates to a solid state memory device, and in particular to a solid state memory device with a housing.

Description of the Related Art

Conventionally, a solid state memory device includes an upper housing member and a lower housing member. The upper housing member is affixed to the lower housing member via a plurality of bolts (usually there are four bolts). The assembly process for fastening the bolts is cumbersome, and the cost of material and of assembly is high.

BRIEF SUMMARY OF THE INVENTION

In one embodiment, a solid state memory device is provided. The solid state memory device includes a housing and a solid state memory module. The housing comprises a housing fastening member, a first housing member, and a second housing member, wherein the second housing member is connected to the first housing member. The solid state memory module is disposed in the housing. The first housing member comprises a plurality of first wedging portions, the second housing member comprises a plurality of second wedging portions, each first wedging portion wedges the corresponding second wedging portion in a first direction, the first housing member further comprises a first fastening portion, the second housing member further comprises a second fastening portion, the housing fastening member affixes the first fastening portion to the second fastening portion in a second direction, and the first direction differs from the second direction.

In one embodiment, the first direction is perpendicular to the second direction.

In one embodiment, each first wedging portion comprises a protrusion, each second wedging portion comprises a recess, and the protrusion is inserted into the recess and is wedged into the recess.

In one embodiment, the protrusion comprises a first protrusion end and a second protrusion end, the width of the first protrusion end is smaller than the width of the second protrusion end, the recess comprises a first recess end and second recess end, the width of the first recess end is smaller than the width of the second recess end, and when the protrusion is inserted into the recess and is wedged into the recess, the first protrusion end correspondingly connects to the first recess end, and the second protrusion end correspondingly connects to the second recess end.

In one embodiment, the first housing member comprises an inner surface, the second housing member comprises a plurality of posts, the first wedging portions are formed on the inner surface, and the second wedging portions are respectively formed on the posts.

In one embodiment, each post comprises a post planer surface and a post curved surface, the post planer surface is opposite the post curved surface, the post curved surface faces the solid state memory module, and the second wedging portion is formed on the post planer surface.

In one embodiment, the posts comprise a first post and a second post, the first post comprises a first post planer surface, one of the second wedging portions is formed on the first post planer surface, and the second fastening portion is formed on the first post planer surface.

In one embodiment, the first fastening portion is a through hole, the second fastening portion is a slot, and the housing fastening member is a bolt. The housing fastening member passes through the first fastening portion in the second direction to be affixed to the second fastening portion.

In one embodiment, the solid state memory module comprises a first circuit board and a second circuit board. The first circuit board is coupled to the second circuit board. The first circuit board is parallel to the second circuit board. The first circuit board comprises a plurality of first memory chips. The second circuit board comprises a plurality of second memory chips. A gap is formed between the first circuit board and the second circuit board. The first housing member comprises a plurality of first ventilation holes. The second housing member comprises a plurality of second ventilation holes. The first ventilation holes are corresponding to the second ventilation holes. The first ventilation holes and the second ventilation holes are both corresponding to the gap.

In one embodiment, the second circuit board comprises a connection port, the second housing member comprises a notch, and the connection port is exposed in the notch.

In the embodiment of the invention, the first wedging portions wedge the second wedging portions in the first direction, and the position of the first housing member relative to the second housing member in the second direction and a third direction is effectively restricted. In the embodiment, there are four first wedging portions, and there are four second wedging portions. The first housing member can therefore be firmly connected to the second housing member. The housing fastening member passes through the first fastening portion in the second direction to be affixed to the second fastening portion. The housing fastening member restricts the position of the first housing member relative to the second housing member in the first direction, the second direction and the third direction. Thus, the embodiment of the invention realizes fastening the first housing member to the second housing member with one single housing fastening member (bolt). Utilizing the solid state memory device of the embodiment of the invention, the first housing member is firmly connected to the second housing member with the least number of bolts, and the assembly process is simplified, and the manufacturing cost is decreased.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
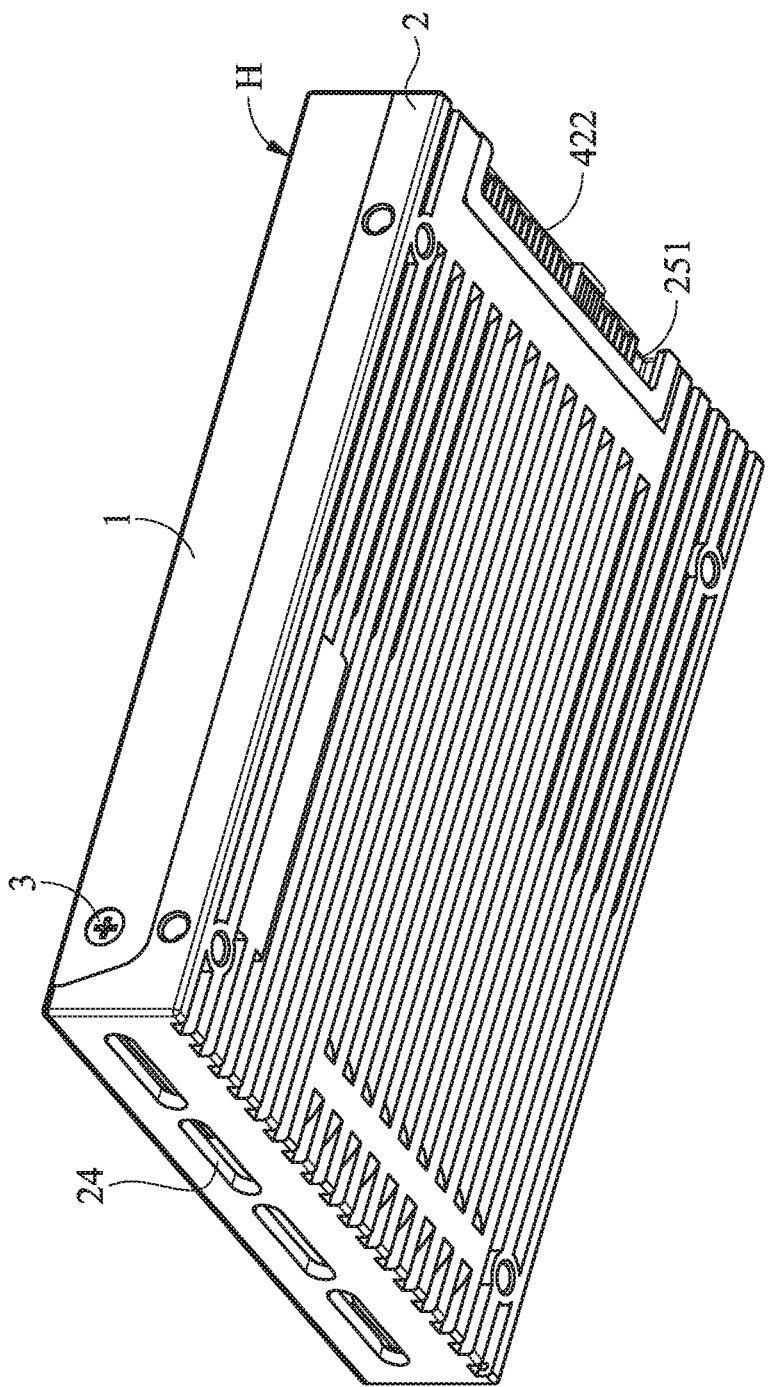
FIG. 1A is a perspective view of a solid state memory device of an embodiment of the invention.
Figure 1B:
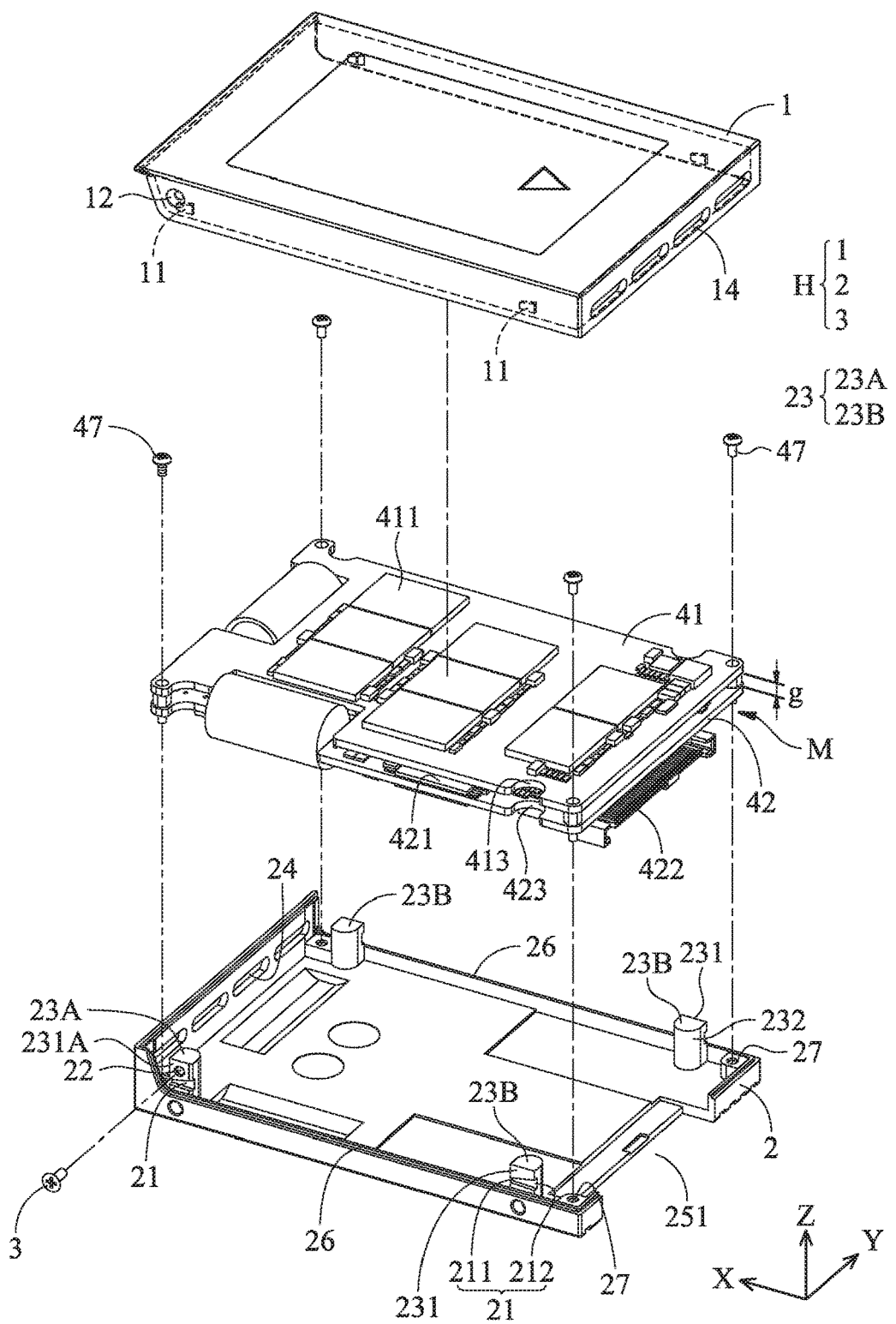
FIG. 1B is an exploded view of the solid state memory device of the embodiment of the invention.

FIG. 1A is a perspective view of a solid state memory device of an embodiment of the invention. FIG. 1B is an exploded view of the solid state memory device of the embodiment of the invention. With reference to FIGS. 1A and 1B, the solid state memory device D of the embodiment of the invention includes a housing H and a solid state memory module M. The housing H comprises a housing fastening member 3, a first housing member 1, and a second housing member 2. The second housing member 2 is connected to the first housing member 1. The solid state memory module M is disposed in the housing H. The first housing member 1 comprises a plurality of first wedging portions 11. The second housing member 2 comprises a plurality of second wedging portion 21. Each first wedging portion 11 wedges the corresponding second wedging portion 21 in a first direction X. The first housing member 1 further comprises a first fastening portion 12. The second housing member 2 further comprises a second fastening portion 22. The housing fastening member 3 affixes the first fastening portion 12 to the second fastening portion 22 in a second direction Y, and the first direction X differs from the second direction Y.

With reference to FIG. 1B, in one embodiment, the first direction X is perpendicular to the second direction Y.

Figure 2:
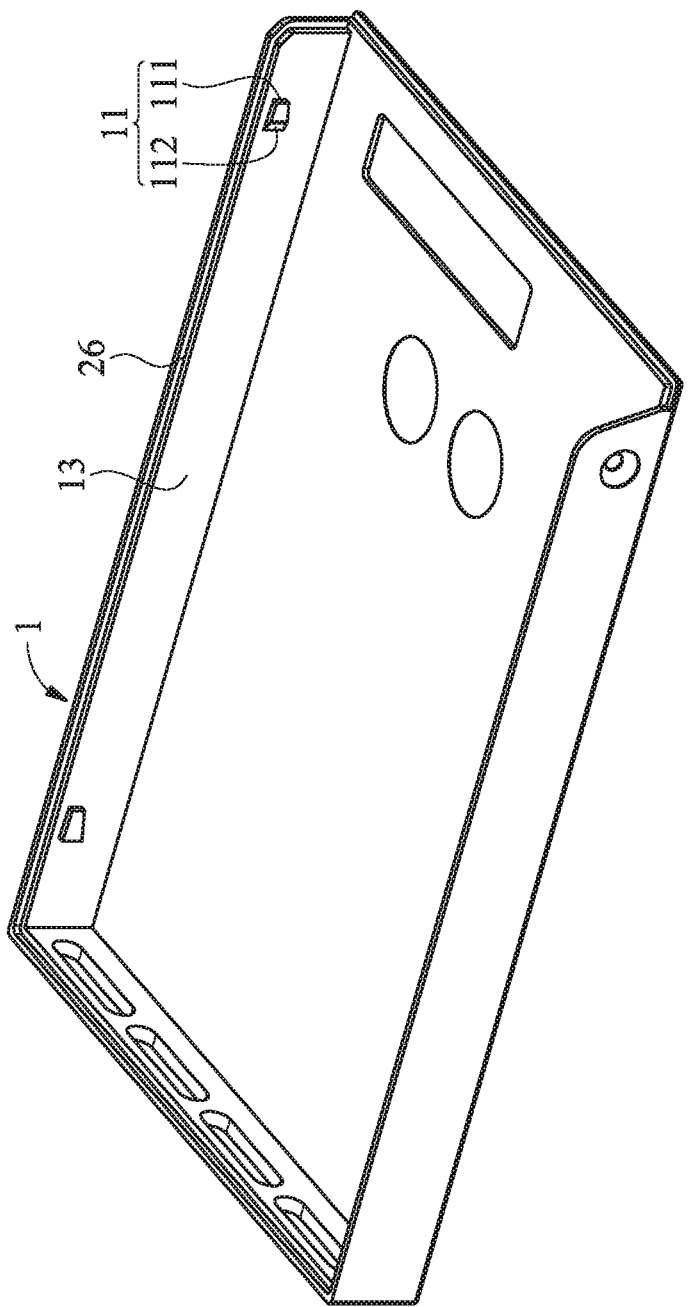
FIG. 2 shows details of a first housing member of the embodiment of the invention.
Figure 3:
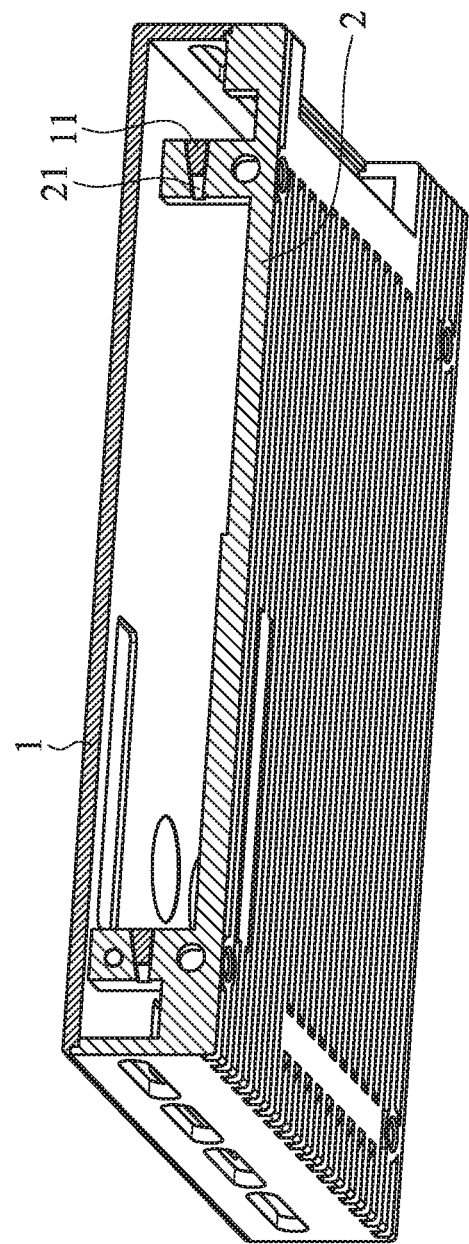
FIG. 3 shows the first housing member being connected to a second housing member of the embodiment of the invention.

FIG. 2 shows details of the first housing member 1 of the embodiment of the invention. FIG. 3 shows the first housing member 1 being connected to the second housing member 2 of the embodiment of the invention. With reference to FIGS. 1B, 2 and 3, in one embodiment, each first wedging portion 11 is a protrusion, each second wedging portion 21 is a recess, and the protrusion (11) is inserted into the recess (21) and is wedged into the recess (21).

With reference to FIGS. 1B, 2 and 3, in details, the protrusion 11 comprises a first protrusion end 111 and a second protrusion end 112. The width of the first protrusion end 111 is smaller than the width of the second protrusion end 112. The recess 21 comprises a first recess end 211 and second recess end 212. The width of the first recess end 211 is smaller than the width of the second recess end 212. When the protrusion 11 is inserted into the recess 21 and is wedged into the recess 21, the first protrusion end 111 correspondingly connects to the first recess end 211, and the second protrusion end 112 correspondingly connects to the second recess end 212.

With reference to FIGS. 1B, 2 and 3, in one embodiment, the first housing member 1 comprises an inner surface 13. The second housing member 2 comprises a plurality of posts 23. The first wedging portions 11 are formed on the inner surface 13, and the second wedging portions 21 are respectively formed on the posts 23.

With reference to FIGS. 1B, 2 and 3, in one embodiment, each post 23 comprises a post planer surface 231 and a post curved surface 232. The post planer surface 231 is opposite the post curved surface 232. The post curved surface 232 faces the solid state memory module M. The second wedging portion 21 is formed on the post planer surface 231.

With reference to FIGS. 1B, 2 and 3, in one embodiment, the posts 23 comprise a first post 23A and a second post 23B. The first post 23A comprises a first post planer surface 231A. One of the second wedging portions 21 is formed on the first post planer surface 213A. The second fastening portion 22 is formed on the first post planer surface 231A.

With reference to FIGS. 1B, 2 and 3, in one embodiment, the first fastening portion 12 is a through hole, and the second fastening portion 22 is a slot, and the housing fastening member 3 is a bolt. The housing fastening member 3 passes through the first fastening portion 12 in the second direction Y to be affixed to the second fastening portion 22.

In the embodiment of the invention, the first wedging portions 11 wedge the second wedging portions 21 in the first direction X, and the position of the first housing member 1 relative to the second housing member 2 in the second direction Y and a third direction Z is effectively restricted. In the embodiment, there are four first wedging portions 11, and there are four second wedging portions 21. The first housing member 1 can therefore be firmly connected to the second housing member 2. The housing fastening member 3 passes through the first fastening portion 12 in the second direction Y to be affixed to the second fastening portion 22. The housing fastening member 3 restrict the position of the first housing member 1 relative to the second housing member 2 in the first direction X, the second direction Y and the third direction Z. Thus, the embodiment of the invention realizes fastening the first housing member 1 to the second housing member 2 with one single housing fastening member 3 (bolt). Utilizing the solid state memory device M of the embodiment of the invention, the first housing member 1 is firmly connected to the second housing member 2 with the least number of bolts, and the assembly process is simplified, and the manufacturing cost is decreased.

In the embodiment above, there are four first wedging portions 11, and there are four second wedging portions 21. However, the disclosure is not meant to restrict the invention. For example, in one embodiment, there may be three first wedging portions 11, and there may be three second wedging portions 21. The first post 23A comprises a first post planer surface 231A. The second fastening portion 22 is formed on the first post planer surface 231A. There is no second wedging portion formed on the first post planer surface 231A.

With reference to FIGS. 1B, 2 and 3, in one embodiment, the solid state memory module M comprises a first circuit board 41 and a second circuit board 42. The first circuit board 41 is coupled to the second circuit board 42. The first circuit board 41 is parallel to the second circuit board 42. The first circuit board 41 comprises a plurality of first memory chips 411. The second circuit board 42 comprises a plurality of second memory chips 421. A gap g is formed between the first circuit board 41 and the second circuit board 42. The first housing member 1 comprises a plurality of first ventilation holes 14. The second housing member 2 comprises a plurality of second ventilation holes 24. The first ventilation holes 14 are corresponding to the second ventilation holes 24, and the first ventilation holes 14 and the second ventilation holes 24 are both corresponding to the gap g.

With reference to FIG. 1B, in one embodiment, the second housing member 2 further comprises a plurality of fastening bases 27. The solid state memory module M further comprises a plurality of module fastening members 47 (bolts). The module fastening members 47 pass through the first circuit board 41 and the second circuit board 42 to be affixed to the fastening bases 27.

With reference to FIG. 1B, in one embodiment, the first circuit board 41 comprises a plurality of first circuit board notches 413, and the second circuit board 42 comprises a plurality of second circuit board notches 423. The first circuit board notches 413 and the second circuit board notches 423 are corresponding to the post curved surfaces 232. In one embodiment, the first circuit board notches 413 and the second circuit board notches 423 are adapted to abut the post curved surfaces 232.

With reference to FIGS. 1A and 1B, in one embodiment, the second circuit board 42 comprises a connection port 422, and the second housing member 2 comprises a notch 251. The connection port 422 is exposed in the notch 251. In one embodiment, the connection port 422 can be the U.2, the PCIE or the SATA connection port.

Figure 4A:
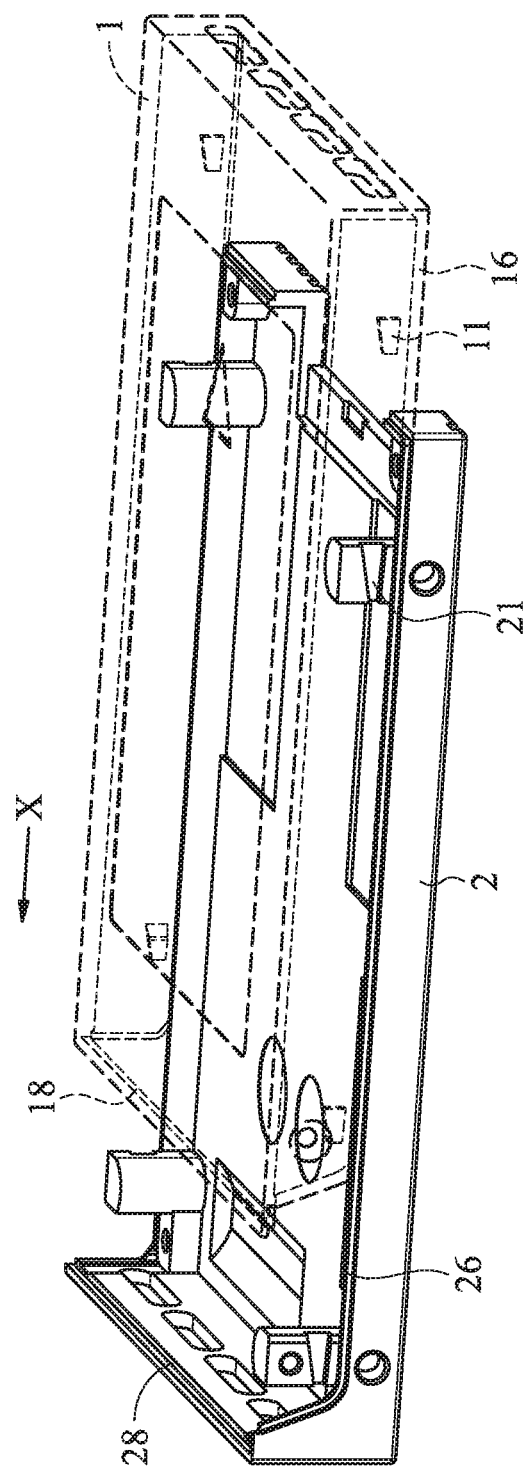
FIG. 4A shows the first housing member being connected to the second housing member in the first direction of the embodiment of the invention, wherein the first housing member is not sufficiently connected to the second housing member.
Figure 4B:
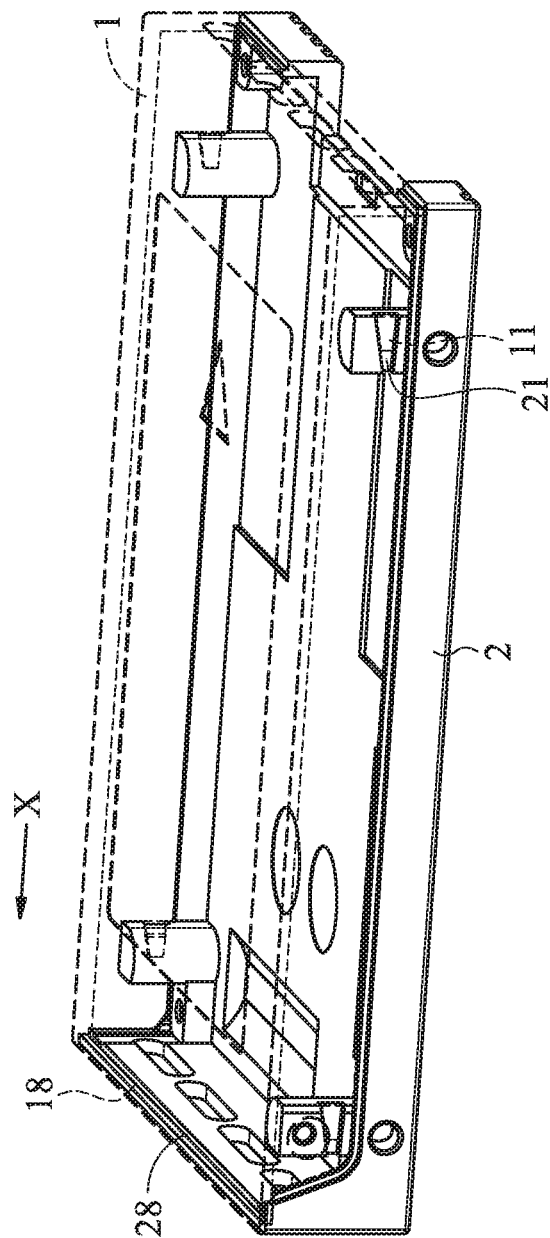
FIG. 4B shows the first housing member being connected to the second housing member in the first direction of the embodiment of the invention, wherein the first housing member is sufficiently connected to the second housing member.

FIG. 4A shows the first housing member being connected to the second housing member in the first direction of the embodiment of the invention, wherein the first housing member is not sufficiently connected to the second housing member. FIG. 4B shows the first housing member being connected to the second housing member in the first direction of the embodiment of the invention, wherein the first housing member is sufficiently connected to the second housing member. With reference to FIGS. 1B, 4A and 4B, in one embodiment, the first housing member 1 further comprises two guiding grooves 16, and the second housing member 2 further comprises two guiding ribs 26. The guiding grooves 16 are formed on the two sides of the first housing member 1. The guiding ribs 26 are formed on the two sides of the second housing member 2. With reference to FIG. 4A, when the first housing member 1 is connected to the second housing member 2 in the first direction, the guiding grooves 16 abut the guiding ribs 26, and are moved relative to the guiding ribs 26. Therefore, the first housing member 1 slides in the first direction X relative to the second housing member 2 in the first direction X. With reference to FIG. 4B, in this embodiment, when the first housing member 1 is sufficiently connected to the second housing member 2, a front end 18 of the first housing member 1 sufficiently abuts a front end 28 of the second housing member 2.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A solid state memory device, comprising:
   a housing, comprising a housing fastening member, a first housing member, and a second housing member, wherein the second housing member is connected to the first housing member; and
   a solid state memory module, disposed in the housing, wherein the first housing member comprises a plurality of first wedging portions, the second housing member comprises a plurality of second wedging portions, each first wedging portion wedges the corresponding second wedging portion in a first direction, the first housing member further comprises a first fastening portion, the second housing member further comprises a second fastening portion, the housing fastening member affixes the first fastening portion to the second fastening portion in a second direction, and the first direction differs from the second direction.

2. The solid state memory device as claimed in claim 1, wherein the first direction is perpendicular to the second direction.

3. The solid state memory device as claimed in claim 1, wherein each first wedging portion comprises a protrusion, each second wedging portion comprises a recess, and the protrusion is inserted into the recess and is wedged into the recess.

4. The solid state memory device as claimed in claim 3, wherein the protrusion comprises a first protrusion end and a second protrusion end, a width of the first protrusion end is smaller than a width of the second protrusion end, the recess comprises a first recess end and second recess end, a width of the first recess end is smaller than a width of the second recess end, and when the protrusion is inserted into the recess and is wedged into the recess, the first protrusion end correspondingly connects to the first recess end, and the second protrusion end correspondingly connects to the second recess end.

5. The solid state memory device as claimed in claim 3, wherein the first housing member comprises an inner surface, the second housing member comprises a plurality of posts, the first wedging portions are formed on the inner surface, and the second wedging portions are respectively formed on the posts.

6. The solid state memory device as claimed in claim 5, wherein each post comprises a post planer surface and a post curved surface, the post planer surface is opposite the post curved surface, the post curved surface faces the solid state memory module, and the second wedging portion is formed on the post planer surface.

7. The solid state memory device as claimed in claim 5, wherein the posts comprise a first post and a second post, the first post comprises a first post planer surface, one of the second wedging portions is formed on the first post planer surface, and the second fastening portion is formed on the first post planer surface.

8. The solid state memory device as claimed in claim 7, wherein the first fastening portion is a through hole, the second fastening portion is a slot, the housing fastening member is a bolt, and the housing fastening member passes through the first fastening portion in the second direction to be affixed to the second fastening portion.

9. The solid state memory device as claimed in claim 1, wherein the solid state memory module comprises a first circuit board and a second circuit board, the first circuit board is coupled to the second circuit board, the first circuit board is parallel to the second circuit board, the first circuit board comprises a plurality of first memory chips, the second circuit board comprises a plurality of second memory chips, a gap is formed between the first circuit board and the second circuit board, the first housing member comprises a plurality of first ventilation holes, the second housing member comprises a plurality of second ventilation holes, the first ventilation holes are corresponding to the second ventilation holes, and the first ventilation holes and the second ventilation holes are both corresponding to the gap.

10. The solid state memory device as claimed in claim 9, wherein the second circuit board comprises a connection port, the second housing member comprises a notch, and the connection port is exposed in the notch.

* * * * *